United States Patent
Laude et al.

(10) Patent No.: US 7,871,707 B2
(45) Date of Patent: Jan. 18, 2011

(54) POLYMER COMPRISING SILICONE AND METAL TRACE

(75) Inventors: Lucien D. Laude, rue du Chateau (FR); Robert J. Greenberg, Los Angeles, CA (US)

(73) Assignee: Second Sight Medical Products, Inc., Sylmar, CA (US)

( * ) Notice: Subject to any disclaimer, the term of this patent is extended or adjusted under 35 U.S.C. 154(b) by 1158 days.

(21) Appl. No.: 11/506,617

(22) Filed: Aug. 17, 2006

(65) Prior Publication Data

US 2007/0104944 A1    May 10, 2007

Related U.S. Application Data

(62) Division of application No. 11/270,907, filed on Nov. 10, 2005.

(51) Int. Cl.
*B32B 15/08* (2006.01)
(52) U.S. Cl. .................................. 428/450; 524/588
(58) Field of Classification Search ............. 428/450; 524/588
See application file for complete search history.

(56) References Cited

U.S. PATENT DOCUMENTS

| 5,599,592 | A | 2/1997 | Laude |
| 5,935,155 | A | 8/1999 | Humayun et al. |
| 6,743,345 | B2 | 6/2004 | Belouet et al. |
| 6,878,643 | B2 | 4/2005 | Krulevitch et al. |

OTHER PUBLICATIONS

Silicones,—by G.G. Freeman, Published for the Plastics Institute, ILIFFE Books Ltd. (1962) p. 79-84.*
Vince, V., et al., Biocompatibility of Platinum-Metallized Silicone Rubber: in Vivo and in Vitro Evaluation, J. Biomater. Sci. Polymer Edn, 2004, pp. 173-188, vol. 15, No. 2.
Laude, L.D., et al., Laser Metallization for Microelectronics and Bio-Applications, Photon Processing in Microelectronics and Photonics, II, 2003, pp. 578-586, SPIE, vol. 4977.

* cited by examiner

*Primary Examiner*—Kuo-Liang Peng
(74) *Attorney, Agent, or Firm*—Scott B. Dunbar; Gary Schnittgrund; Tomas Lendvai

(57) ABSTRACT

A flexible electrode array of silicone containing oxide particles of $SiO_2$, $TiO_2$, $Sb_2O_3$, $SnO_2$, $Al_2O_3$, ZnO, $Fe_2O_3$, $Fe_3O_4$, talc, hydroxyapatite or their mixtures and at least one metal trace in a silicone-containing polymer.

13 Claims, 4 Drawing Sheets

US 7,871,707 B2

POLYMER COMPRISING SILICONE AND METAL TRACE

CROSS-REFERENCE TO RELATED APPLICATION(S)

This patent application is a divisional application of U.S. patent application Ser. No. 11/270,907, filed Nov. 10, 2005 the disclosure of which is incorporated herein by reference.

BACKGROUND OF THE INVENTION

1. Field of the Invention

The present invention relates to a silicone polymer material comprising at least one metal trace and a process of manufacturing the same.

2. Description of Related Art

In U.S. Pat. No. 6,743,345 "Method of Metallizing a Substrate" to Christian Belouet et al. a process for metallizing a substrate is disclosed, comprising coating the part with a precursor composite material layer consisting of a polymer matrix doped with photoreducer material dielectric particles; irradiating the surface of the substrate with a light beam emitted by a laser; and immersing the irradiated part in an autocatalytic bath containing metal ions, with deposition of the metal ions in a layer on the irradiated surface, and wherein the dimension of the dielectric particles is less than or equal to 0.5 µm. The process includes three steps. The first step is to coat the substrate part with a precursor composite material layer consisting of a polymer matrix doped with photoreducer material dielectric particles. The second step is to irradiate the surface of the substrate with a light beam emitted by a laser. The third step is to immerse the irradiated part in an autocatalytic bath containing metal ions, with deposition of the metal ions in a layer on the irradiated surface, wherein the dimension of the dielectric particles is less than or equal to 0.5 µm.

In U.S. Pat. No. 5,599,592 "Process for the Metallization of Polymer Materials and Products Thereto Obtained" to Lucien D. Laude a positive metallization process for metallizing a polymer composite piece containing a polymer material and oxide particles is disclosed, the oxide particles being made of one or more oxides, comprising three successive steps. The first step consists of the irradiation of a surface area of a polymer piece to be metallized with a light beam emitted by an excimer laser. The polymer piece is made from a polymer material and oxide particles. The oxide particles are made from one or more oxides. The second step consists of immersing the irradiated polymer piece in at least one autocatalytic bath containing metal ions. The immersion induces the deposit of the metal ions onto the irradiated surface area to form a metal film on the surface area, resulting in the selective metallization of the surface area of the polymer piece. The third step consists of thermally processing the metallized polymer piece to induce diffusion of the deposited metal film into the polymer material of the polymer piece. The disclosure of U.S. Pat No. 5,599,592 is incorporated herein by reference.

Lucien D. Laude et al. report that excimer lasers are effective tools in engraving ceramics and polymers, changing irreversibly the surface of the irradiated material, and restricting these effects to specific areas of interest. See L. D. Laude, K Kolev, Cl. Dicara and C. Dupas-Bruzek "Laser Metallization for Microelectronics for Bio-applications", Proc. of SPIE Vol. 4977 (2003), pp 578-586.

In U.S. Pat. No. 5,935,155 "Visual Prosthesis and Method of Using Same" to Mark S. Humayan et al. it is disclosed a visual prosthesis, comprising means for perceiving a visual image, said means producing a visual signal output in response thereto; retinal tissue stimulation means adapted to be operatively attached to a retina of a user; and wireless visual signal communication means for transmitting said visual signal output to said retinal tissue stimulation means.

In U.S. Pat. No. 6,878,643 "Electronic Unit integrated Into a Flexible Polymer Body" to Peter a. Krulevitch et al. it is disclosed a method of fabricating an electronic apparatus, comprising the steps of providing a silicone layer on a matrix, providing a metal layer on said silicone layer, providing a second layer of silicone on said silicone layer, providing at least one electronic unit connected to said metal layer, and removing said electronic apparatus from said matrix wherein said silicone layer and said second layer of a silicone provide a spherical silicone body.

J. Delbeke et al. demonstrate that silicone rubber biocompatibility is not altered by the metallization method. See V. Cince, M.-A. Thil, C. Veraart, I. M. Colin and J. Delbeke "Biocompatibility of platinum-metallized silicone rubber: in vivo and in vitro evaluation", *J. Biomater. Sci. Polymer Edn*, Vol. 15, No. 2, pp. 173-188 (2004).

There is a need and a high desire for a soft and biocompatible polymer layer with high insulation properties containing embedded very fine metal traces. There is further a need and a high desire for an economical and ecological process of manufacturing such polymer layers.

SUMMARY OF THE INVENTION

The invention is a polymer layer comprising silicone containing oxide particles of $SiO_2$, $TiO_2$, $Sb_2O_3$, $SnO_2$, $Al_2O_3$, ZnO, $Fe_2O_3$, $Fe_3O_4$, talc, hydroxyapatite or mixtures thereof and at least one metal trace embedded in the polymer layer bonded by a silicone metal bond.

Another aspect is a flexible electrode array comprising silicone containing oxide particles of $SiO_2$, $TiO_2$, $Sb_2O_3$, $SnO_2$, $Al_2O_3$, ZnO, $Fe_2O_3$, $Fe_3O_4$, talc, hydroxyl-apatite or mixtures thereof and at least one metal trace embedded in said polymer layer.

DETAILED DESCRIPTION OF THE INVENTION

Figure 1:
FIG. 1 depicts a cross-sectional view of a substrate.

The present invention relates preferably to the metallization of a polymer, generally Si-based polymers. A more preferred embodiment of the present invention is the metallization of polymers with platinum (Pt). The most preferred embodiment is a polymer layer comprising at least one metal trace embedded in the polymer layer.

The preferred polymer of the present invention is a silicone containing polymer. Silicone means, in view of the present invention, any and all possible silicone elastomer formulations, silicone craft polymers, silicone copolymers, silicone-silicone copolymers, silicone-hydrocarbon copolymers, silicone block polymers, silicone block copolymers, silicone rubbers or mixtures thereof. Silicone may contain any type and amount of additives.

The most common method for preparing silicones involves the reaction of a chlorosilane with water. This produces a hydroxyl intermediate, which condenses to form a polymer-type structure. The basic reaction sequence is represented as follows:

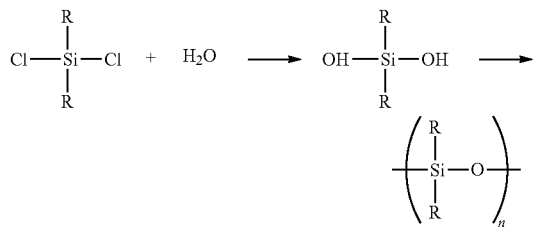

n is an integer >1.

Other raw materials such as alkoxysilanes can be used as well. Chlorosilanes and other silicone precursors are synthesized by a direct process, involving the reaction of elemental silicone with an alkyl halide as follows:

$$Si + RX \rightarrow R_n SiX_{4-n} \text{ (where n=0-4)}$$

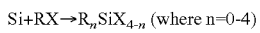

Silicone elastomers have high molecular weight, generally greater than 500,000 g/mol. The production of these types of materials requires di-functional precursors, which form polymer structures. Mono and tri-functional precursors form terminal structures and branched structures respectively.

Silicone rubbers contain usually cured additives like peroxides such as benzoyl peroxide, 2,4-dichlorobenzoyl peroxide, t-butyl perbenzoate and dicumyl peroxide. Alkyl hydroperoxides and dialkyl peroxides have also been used successfully with vinyl containing silicones.

Hydrosilylation or hydrosilation is an alternative curing method for vinyl containing silicones and utilizes hydrosilane materials and platinum containing compounds for catalysts. It is a two part process requiring mixing of two separate components, with the resulting material having a limited shelf life. Curing does not produce volatiles and heat cured conventional silicones with high tear strengths can be cured in this way.

Reinforcing fillers are added to improve the otherwise poor tensile strength of silicones. Silica, in the form of silica fume, silica foam, or fumed silica with particle sizes in the range 10 nm-40 nm is the most preferred filler, although carbon black has been used. Fillers do interact with the vulcanisate, forming a pseudo-vulcanization. This can occur either during mixing and creep hardening or in storage and bin ageing.

Fumed silica has unique properties and is commonly added to liquids/coatings and solids to improve various properties. Fumed silica has chain-like particle morphology. In liquids, the chains bond together via weak hydrogen bonds forming a three dimensional network, trapping liquid and effectively increasing the viscosity. The effect of the fumed silica can be negated by the application of a shear force for example mixing, brushing, spraying etc., allowing the liquid to flow, level out and permit the escape of entrapped air.

One production method for the production of fumed silica involved a continuous flame hydrolysis technique. It involves the conversion of silicon tetrachloride ($SiCl_4$) to the gas phase using an oxygen-hydrogen flame. It then reacts with water to yield silica ($SiO_2$) and hydrochloric acid thus:

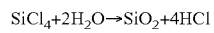

$$SiCl_4 + 2H_2O \rightarrow SiO_2 + 4HCl$$

HCl can easily be separated as it remains in the gas phase, while $SiO_2$ is solid in the form of fumed silica.

Silicone can be in large variation of shapes and forms, such as thin sheets obtained by spun coating or spray coating, foil obtained by lamination or molding, bloc molded pieces, distributed silicone, silicone mixed with thermoplastic material.

The present invention provides a cured silicone layer which has a preferred thickness of 10 micrometers (μm) to 80 μm, preferably 20 μm to 40 μm. This layer contains laser-drawn traces up to 10 μm to 20 μm traces or pads with a dimension of 100 μm to 200 μm which are filled with metallized deposit.

The present invention further provides a silicone layer which has a preferred thickness of 15 μm to 25 μm. This layer contains laser-drawn traces having a width of to 10 μm to 20 μm which are filled with metallized deposit, preferably with Pt. Alternately, the polymer comprises metal traces of one or more of the following metals: titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, or gold, or an alloy of two or more metals, or a combination of two or more alloys or metal layers thereof. This layer contains further a second 15 μm to 25 μm thick silicone layer covering the once metallized first silicone layer. After curing that second silicone layer an optimum silicone-to-silicone adhesion of the second silicone layer provides a fully protected cover to the metallized silicone layer. A full silicone-encapsulation of the once produced metal traces is thereby obtained.

The present invention provides overlapping silicones with different formulations. In the previous aspects of the present invention, silicones have a formulation that contains generally a variable amount of fumed silica (silica foam) that serves to strengthen the polymeric structure in various ways. It also favors the electroless-metallization process and improves substantially the mechanical behavior of metallized silicone. In this aspect of the present invention, the final silicone cover remains unmetallized and serves solely for the purpose of protecting and insulating the underlying metallized silicone layers. That silicone cover may be formed with a silicone that is different from the silicone that has been used for the underlying layers. In particular, it may not contain silica foam at all and may then be more readily applied even to very small layer thickness. Therefore, a silicone cover of 15 μm to 20 μm is formed on the metallized silicone layer. That silicone cover is formed with a silica foam free silicone that is spun onto the metallized silicone before curing as above.

In the metallization process a non-organic powder is dispersed in any given polymer, for example polyamide. The non-organic powder is for example at least one oxide of antimony, aluminum, iron, zinc or tin. The oxide particles have variable particle sizes, preferably smaller than about 50 µm. The concentration of the oxide particles in the polymer exceeds about 1 vol.-% or 1 wt.-%. Alternatively, the polymer comprises one or more of the following metals: titanium, tantalum, chromium, iridium, palladium, platinum, silver, or gold, or an alloy of two or more metals, or a combination of two or more alloys or metal layers thereof.

The surface of the polymer material is irradiated with the light beam emitted by a laser. The light is emitted preferably in the ultraviolet wavelength range, during a very short duration or pulse and repeated if necessary at regular time intervals. The pulsed emission has preferably high energy, for example, between 0.05 J and 1.0 J. It contains a very large number of photons. It may also operate at a wavelength below or equal to about 350 nm which corresponds to photon energy approximately equal to or larger than 3.5 eV. The desired emission may be obtained from an excimer laser source emitted during about 10 ns, at a wavelength of about 248 nm which corresponds to photon energy of 5.0 eV.

The laser beam may be passed through a mask having a specific geometry, and projected upon focalization onto the surface of the material to be treated. A desired processing is obtained beyond a given energy density of about 0.5 J/cm$^2$, or fluence, and as a function of the material optical properties and the laser photon energy.

In case of pure silicone, UV laser irradiation may produce two effects that depend on both fluence and photon energy.

At 248 nm, therefore at 5 eV, the silicone undergoes partial decomposition by breaking the Si—C bonds. This results in ablation of the C-radicals but leaves unaffected the Si—O bonds of the polymer backbone.

At lower wavelengths for example at 193 nm, therefore at 6.2 eV, the silicone undergoes total decomposition by breaking both Si—C and Si—O bonds. This results in a full ablation of silicone, typically at a rate of some 0.5 µm per pulse at 0.5 mJ/cm$^2$, and irrespective of the silicone formulation.

In the case of silicone containing silica, for example silica foam, the 248 nm laser radiation has no effect on the silica particles but the 193 nm does, which leads to a complete ablation of the silicone and its silica additive.

In the second part of the process, silicone treated with the 248 nm laser is immersed in an autocatalytic bath that contains metal ions, for example $Ni^{2+}$, $Cu^{2+}$, or $Pt^{2+}$. These ions are selectively driven to deposit and react on the partially decomposed silicone structure regardless if the treated silicone contains an additive, for example silica foam, or not. The reaction between metal ions and the polymer results in covalent bonding on the Si atoms of the polymer that lost their C-radicals upon irradiation. In the absence of silica foam, metallization occurs but with a poor adhesion of the metallized silicone part. The presence of silica foam enforces substantially the metallized silicone that is obtained after laser treating at 248 nm, since silica remains unaffected at 248 nm.

In contrast, irradiating silicone at 193 nm provides a very efficient way to fully and exclusively ablate silicone, containing silica foam or not. In particular, irradiating silicone at 193 nm allows opening clean and well defined cuts, grooves, blind holes or vias through it. Silicone parts engraved by 193 nm do not metallize by immersing in an autocatalytic bath.

During immersion of the laser processed surface into the autocatalytic bath, metallization is restricted to the actual laser treated surface. The incubation time measures the period of time which is necessary to form a continuous metal film on the composite surface. After that time, the metal deposition, which is usually 10 µm to 20 µm per hour for Ni, may develop perpendicularly to the surface in a most efficient manner.

The advantages of the process of the present invention result directly from the use of an intense and pulsed ultraviolet light beam, as for instance the one emitted by an excimer laser source working at a wavelength equal or inferior to 308 nm. All other light sources working in the visible or infrared range, in pulsed or continuous regime are inactive on silicone.

The preferred irradiation source according to this invention is an excimer laser. The preferred excimer laser performs engraving at about 248 nm with partial decomposition of silicone and allows metallization. The laser pulse duration is in the range of 1 ns to 40 ns by steady or scanning irradiation. In comparison engraving below about 200 nm performs full ablation but no metallization can follow after the ablation.

A silicone layer is spun on a clean glass plate and cured in an oven. The layer may have a near constant thickness at about 40 µm across the glass substrate. The thickness depends on spinning conditions and the content of additives. The higher the content of additives is the more difficult is the spinning. This layer is then scanned with a focused 248 nm excimer laser beam working at a sufficient fluence that allows partial decomposition of the silicone material down to some 10 µm to 15 µm into the layer. The laser processed silicone layer, on its glass substrate, is further immersed in an electroless bath containing metal ions. Subsequently, the latter ions condense solely on the laser-processed areas of the silicone layer where they contribute to form metallized deposits precisely in the laser-drawn areas and remain embedded in the silicone layer without touching the glass substrate underneath.

After preparing the metallized silicone layer on a glass substrate, a second 20 µm thick silicone layer is spun on the once metallized first silicone layer and cured in oven. An optimum silicone to silicone adhesion of the latter is thus achieved that provides a fully protected cover to the metallized silicone layer. The set of two silicone layers may then be pulled from the glass substrate and materializes the full silicone-encapsulation of the once produced metal traces.

Silicones have a formulation that contains generally a variable amount of silica foam additive that serves to strengthen the polymeric structure in various ways. This additive or other form of silica for example fiber also favors the electroless-metallization process and improves substantially the mechanical behavior of metallized silicone. However, the final silicone cover remains un-metallized and serves solely the purpose of protecting the underlying metallized layers. That silicone cover may be formed with a silicone that is different from the one silicone that has been used for the other underlying layers. In particular, it may not contain silica at all and may then be more readily spun, even to very small layer thickness. Therefore, a silicone cover of 20 µm is formed on the last metallized silicone layer. That silicone cover is formed with a silica-free silicone that is spun onto the metallized silicone before curing as above.

The electroless Pt-metallization proceeds via forming a thin so-called black metal film and then goes on a second step of Pt-deposit that thickens the metal layer. That second step is extremely slow being impaired in particular with the formation of H-bubbles on a quite uneven metallizing surface; bubbles that tend to obliterate the surface and limit its direct contacting to the electroless bath. Accelerating this second metallization step may be performed as follows.

After having initiated that second step, the silicone layer on its substrate is removed from the bath and its surface is blown for a few seconds with a hot air jet as produced by a standard air gun. The jet cleans up the surface and heats up the metal deposit. The layer is then returned to the bath for a period of 5 min to 10 min before being removed again from the bath, re-blown as before and re-immersed in the bath. The process is repeated regularly (and automated eventually) at 5 min to 10 min intervals until the necessary metal thickness has been attained. With this transient heat procedure, time reduction from 2 h to 3 h to 30 min in the process of Pt-metallizing is substantial and the metal deposit may attain a large thickness that may not be accessible without it.

The present invention will be further illustrated by the following exemplary explanation of the figures, but it is to be understood that the invention is not meant to be limited to the details described herein. The figures explain the preferred process for producing a silicone layer containing embedded Pt traces.

FIG. 1 depicts a cross-sectional view of a substrate (1). The substrate (1) is a rigid supporting substrate preferably made of glass, molded silicone, ceramic, semiconductor, at least one metal, or at least one metal alloy.

Figure 2:
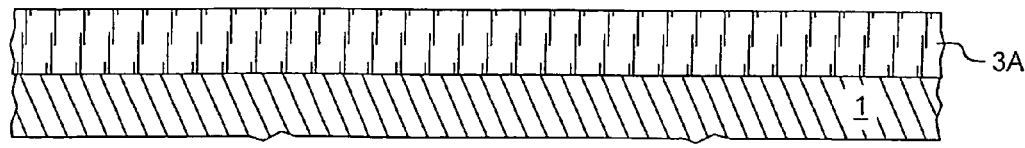
FIG. 2 depicts a cross-sectional view of a substrate and a first polymer layer after curing.

FIG. 2 depicts a cross-sectional view of the substrate (1) and a first silicone layer (3a) after curing. The silicone is preferably applied and distributed by spun coating. Then the sample is heat treated to perform curing of the silicone layer (3a). The silicone layer (3a) is about 20 µm thick.

Figure 3:
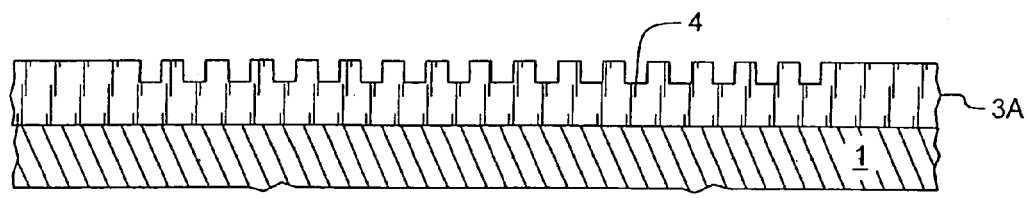
FIG. 3 depicts a cross-sectional view of a substrate and a cured first polymer layer after laser treatment.

FIG. 3 depicts a cross-sectional view of a substrate (1) and a cured first silicone layer (3a) after laser treatment. The desired emission may be obtained from an excimer laser source emitting during about 10 ns, at a wavelength of about 248 nm which corresponds to photon energy of 5 eV. The threshold energy density may be obtained by focalizing the laser beam on the irradiated surface and is usually at about 0.5 $J/cm^2$. The laser beam cuts traces (4) with a preferable trace width of 5 µm to 15

Figure 4:
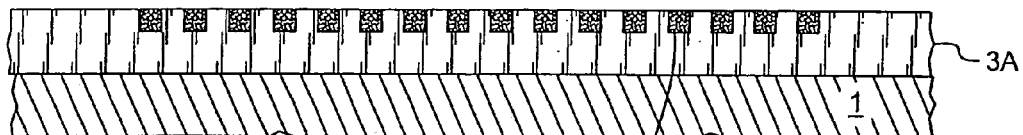
FIG. 4 depicts a cross-sectional view of a substrate and a cured first polymer layer after metallization whereby metal traces are obtained.

FIG. 4 depicts a cross-sectional view of a substrate (1) and a cured first silicone layer (3a) after metallization of the engraved traces (4) whereby Pt traces (5) are obtained. The silicone layer (3a) is immersed in a Pt autocatalytic bath whereby deposition of Pt is induced on.

Figure 5:
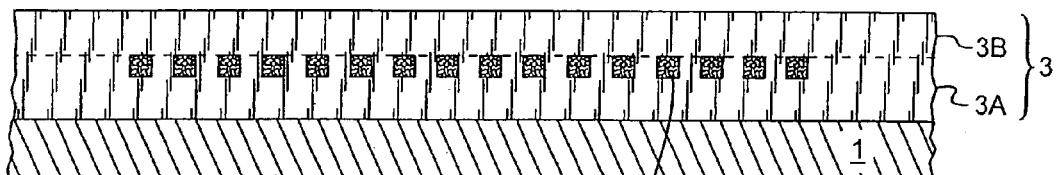
FIG. 5 depicts a cross-sectional view of a substrate and a cured first polymer layer after disposing a second polymer layer on top of the first polymer layer and the metal traces.

FIG. 5 depicts a cross-sectional view of a substrate (1) and a cured first silicone layer (3a) after disposing a second silicone layer (3b) on top of the first silicone layer (3a) and the Pt traces (5). The second silicone layer (3b) is of 15 µm to 20 µm thick.

The used silicones have a formulation that contains generally a variable amount of silica foam additive that serves to strengthen the polymeric structure in various ways. It also favors the electroless-metallization process and improves substantially the mechanical behavior of metallized silicone. The final silicone cover can remain un-metallized and serves solely to the purpose of protecting from ambient of the underlying metallized layers. That silicone cover may be formed with a silicone that is different from the one silicone that has been used for the other underlying layers. In particular, it may not contain silica at all and may then be more readily spun, even to very small layer thickness. Therefore, the silicone cover can be formed with a silica-free silicone that is spun onto the multi-layered metallized silicone before curing as above.

Figure 6:
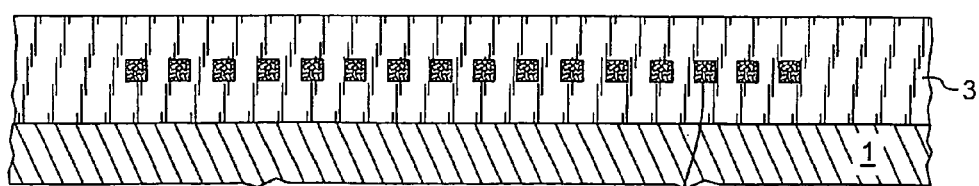
FIG. 6 depicts a cross-sectional view of a substrate and a cured first polymer layer and metal traces after curing the second polymer layer.

FIG. 6 depicts a cross-sectional view of a substrate (1) and a cured first silicone layer (3a) and Pt traces (5) after curing the second silicone layer (3b).

Figure 7:
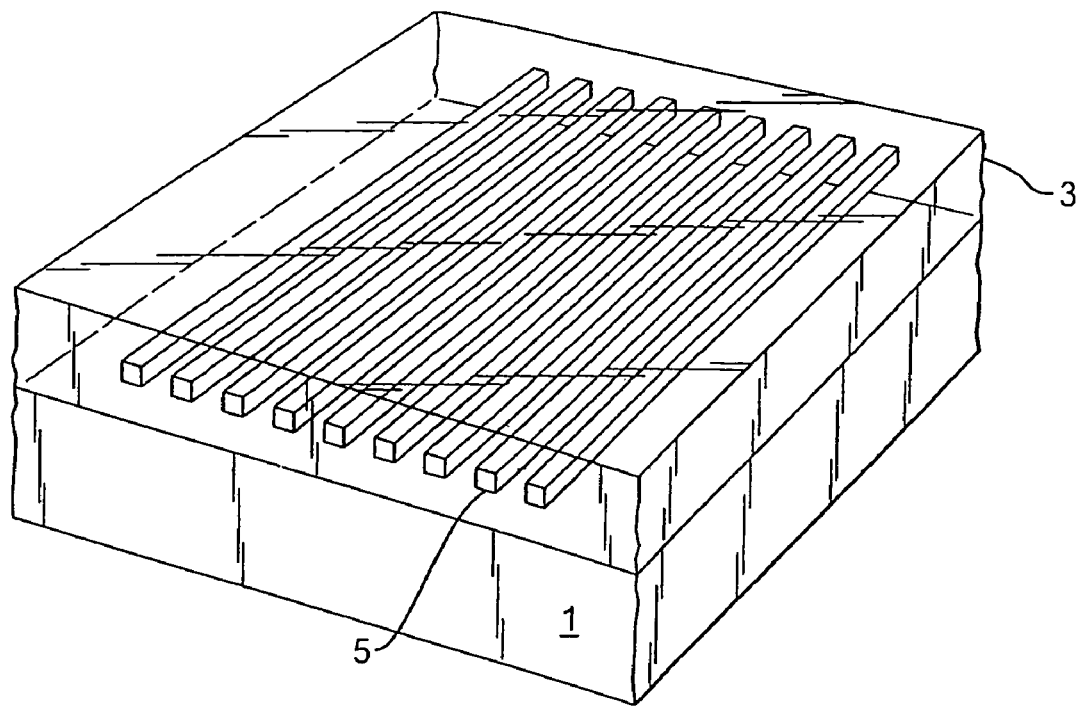
FIG. 7 depicts a perspective view of a cured polymer layer with one embedded series of metal traces as shown in FIG. 6.

FIG. 7 depicts a spherical view of a substrate (1) and a cured silicone polymer layer (3) with one embedded series of Pt traces (5). The first silicone layer (3a) and the second silicone layer (3b) become one silicone layer (3) after curing as shown in FIG. 6.

Figure 8:
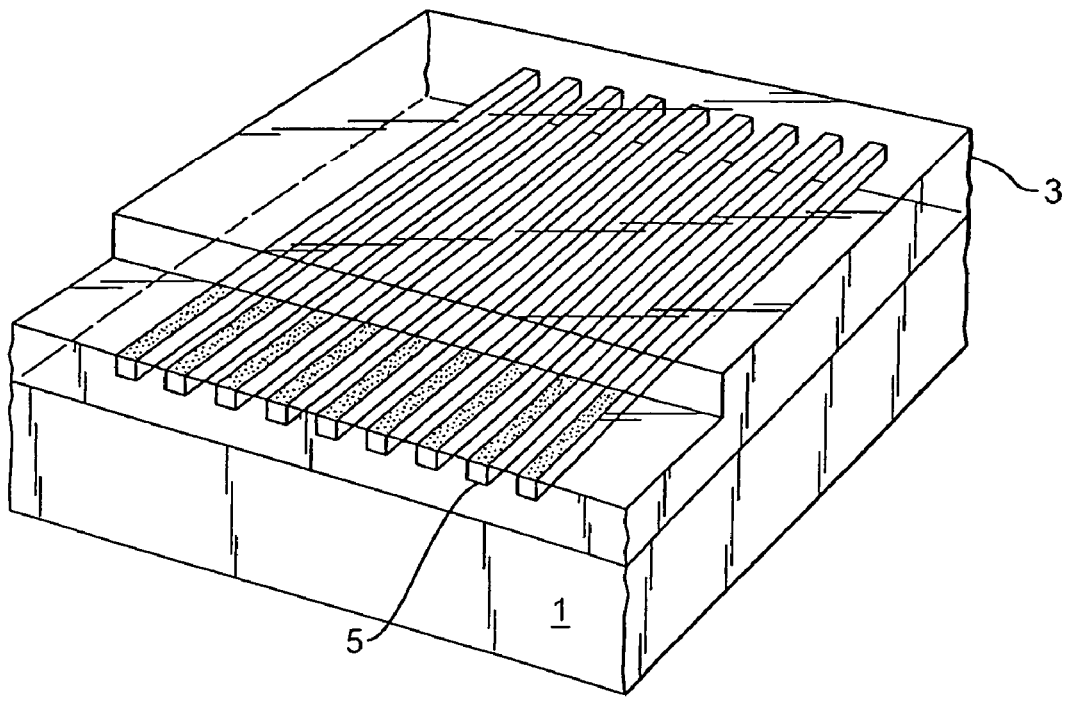
FIG. 8 depicts a perspective view of a cured polymer layer with one embedded series of metal traces as shown in FIG. 6 after a cut out of the polymer.

FIG. 8 depicts a spherical view of a cured silicone polymer layer (3) with one embedded series of Pt traces (5) after a cut out of the silicone as performed by laser irradiating at about 193 nm to enable connection of the Pt traces (5) to external electrodes or other devices.

Figure 9:
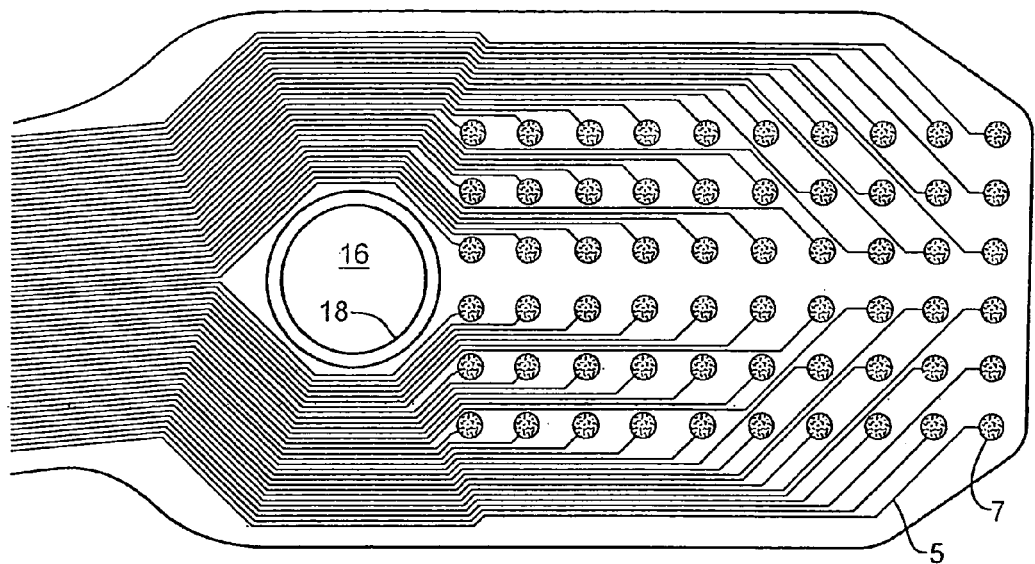
FIG. 9 depicts a top view of a flexible circuit electrode array.
Figure 10:
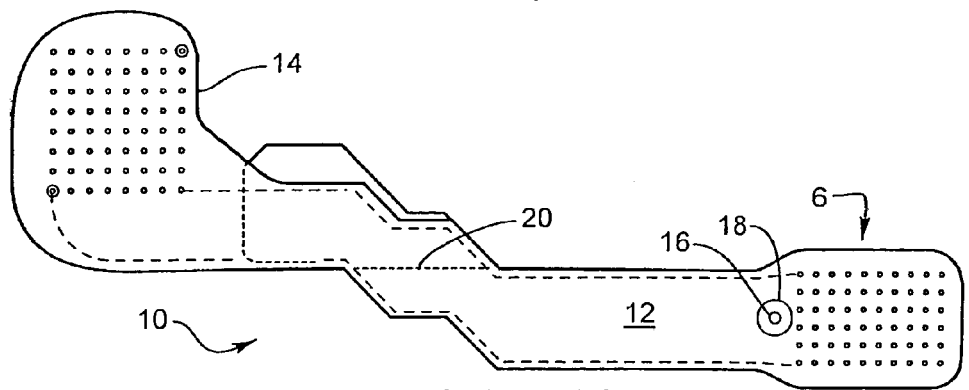
FIG. 10 depicts a top view of a body comprising a flexible circuit electrode array, a flexible circuit cable and a bond pad before it is folded
Figure 11:
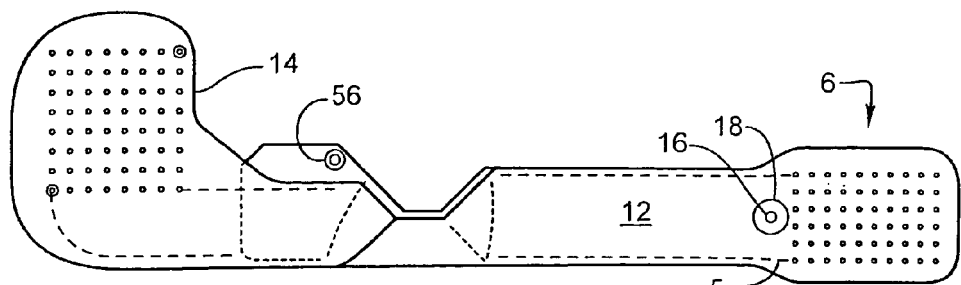
FIG. 11 depicts a top view of a body comprising a flexible circuit electrode array, a flexible circuit cable and a bond pad after it is folded.

FIG. 9 depicts an enlarged top view of a flexible circuit electrode array (6) which is a part of the body (10) as shown for example in FIGS. 10 and 11. The preferred positions of the electrodes (7) and the preferred wiring by the platinum trace (5) both embedded in the silicone layer (3) are shown in FIG. 9. The trace metal preferably contains platinum. The electrodes (7) contain preferably platinum. The preferred flexible electrode array (6) of the present invention comprises silicone polymer (3) containing oxide particles of $SiO_2$, $TiO_2$, $Sb_2O_3$, $SnO_2$, $Al_2O_3$, ZnO, $Fe_2O_3$, $Fe_3O_4$, talc, hydroxyapatite or mixtures thereof and at least one metal trace (5), preferably platinum, embedded in said polymer layer and which contains platinum electrodes (7).

FIGS. 10 and 11 depict a body (10) containing the flexible circuit electrode array (6), a flexible circuit cable (12) and the interconnection pad (14). At one end of the flexible circuit cable (12) is an interconnection pad (14). At the other end of the flexible circuit cable (12) is the flexible circuit electrode array (6). Further, an attachment point (16) is provided near the flexible circuit electrode array (6). A retina tack (not shown) is placed through the attachment point (16) to hold the flexible circuit electrode array (6) to the retina. A stress relief (18) is provided surrounding the attachment point (16). The stress relief (18) may be made of a softer polymer than the flexible circuit, or it may include cutouts or thinning of the polymer to reduce the stress transmitted from the retina tack to the flexible circuit electrode array (6). FIG. 10 depicts that the flexible circuit cable (12) is formed in a dog leg pattern so then when it is folded at fold (20) it effectively forms a straight flexible circuit cable (12) with a narrower portion at the fold (20) for passing through the sclerotomy. FIG. 11 depicts the flexible circuit electrode array (6) after the flexible circuit cable (12) is folded.

Figure 12:
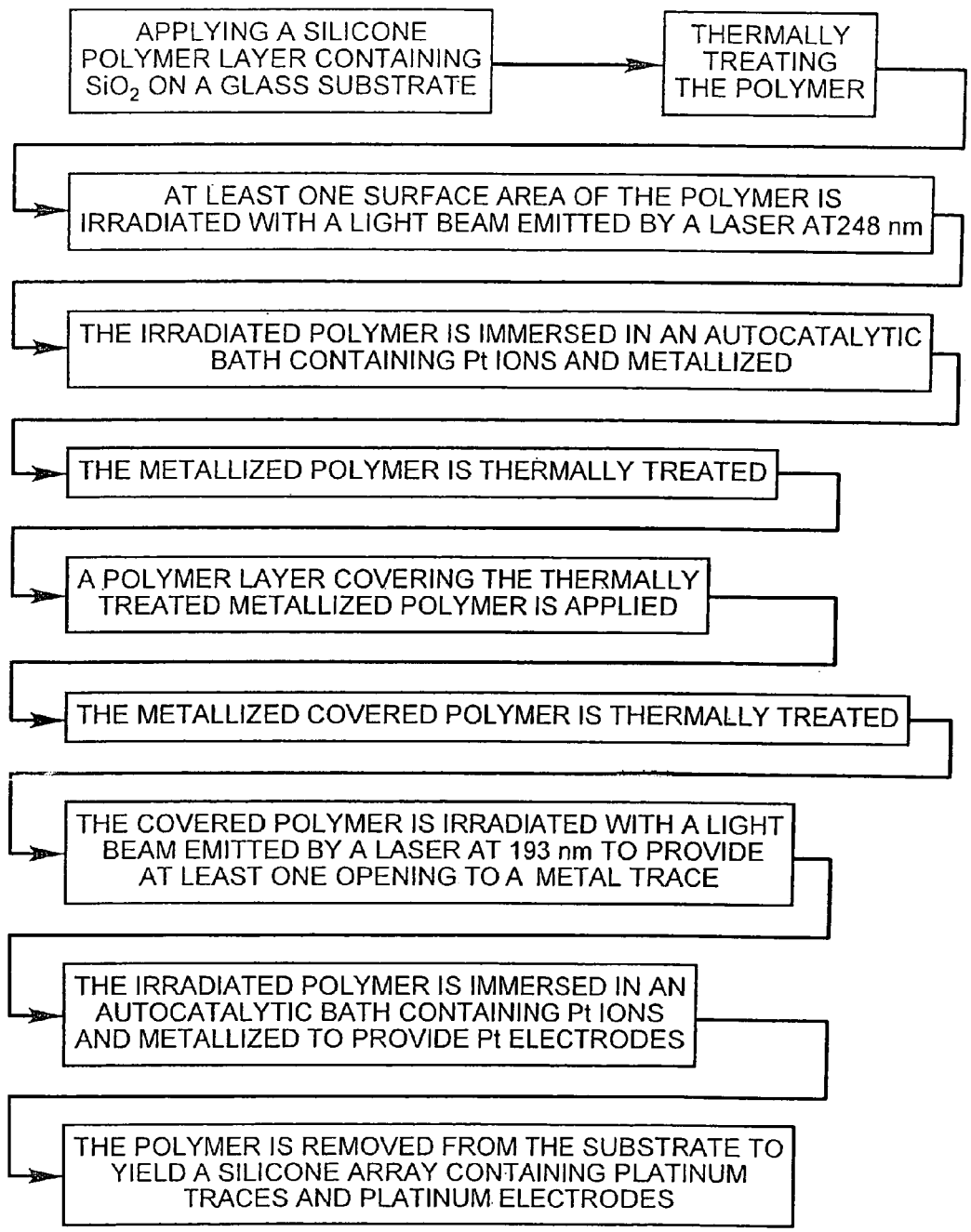
FIG. 12 depicts a flow chart explaining an example of the process.

FIG. 12 depicts a flow chart which is an example for the manufacturing of a flexible electrode array containing a polymer comprising silicone, $SiO_2$, and platinum traces and electrodes.

The platinum metallization of silicone is a process of several steps which are explained in the following example.

EXAMPLE

1. Protective Coating with PMMA

A silicone sheet (NuSil MED 4950 from NUSIL TECHNOLOGY LLC, Carpinteria, California) having a thickness of 80 µm was spray-coated with a 2 µm thick PMMA layer. The silicone sheet was immersed for five minutes in an ultrasonic bath at 40° C., containing a low acidity 1.5% HCl solution. The silicone sheet was than two times rinsed with distilled water.

2. First Metallization

The silicone sheet was Pt-metallized for 6 hours in two successive platinization baths.

The silicone sheet was immersed in 100 ml plating solution containing 0.6 g of potassium (II) tetra-nitro-platinate, 20 ml of ammonium hydroxide 28%, and 0.2 g of complexing agent. The silicone sheet was then rinsed with distilled water.

3. Removal of PMMA Protective Coating:

The silicone sheet was immersed in two successive and fresh ultrasonic baths for five minutes each containing $CHCl_3$ that dissolved the PMMA protection layer. The silicone sheet was two times rinsed for 5 minutes to 10 minutes in ultrasonic distilled water bath and dried.

4. Final Metallization

Silicone sheet was mounted on a glass cylinder. The glass with the silicone sheet was immersed in the same metallizing solution being in a thermo stated vessel for 3 hours to 5 hours. From time to time (e.g. every 10 minutes), $H_2$ bubbles are eliminated from sheeting by vibrating the cylinder or by heat flashing the silicone sheet. The silicone sheet was rinsed in distilled water at the end of the procedure.

PMMA coating allowed removal of irradiation residues that were generated during irradiation and could sediment laterally to the irradiated areas. It should be operated at constant pressure of the PMMA suspension, scanning the sheeting at fixed distance and constant speed, and in a clean environment (either grey room or glove box under Argon atmosphere).

Step-two glass cylinder and thermo stated vessel both were specifically designed for this purpose. The present invention provides the metallizing of an expanded silicone layer for enhanced metal imbedding. A silicone is applied on a glass cylinder. After inscribing the laser-processed traces on the convex, expanded silicone surface, the silicone layer on the glass cylinder is brought in an electroless Pt bath for metallization of the traces. The metallized silicone layer is detached from the glass cylinder and recovers its original planar geometry. The expanded Pt-traces contract enclosing the metal parts into silicone and providing an enhanced integration of these traces into the silicone layer. The once-expanded Pt-traces at time of their production contract and enclose the metal parts in the silicone providing an enhanced integration of these traces into the silicone layer.

While the invention has been described by means of specific embodiments and applications thereof, it is understood that numerous modifications and variations could be made thereto by those skilled in the art without departing from the spirit and scope of the invention. It is therefore to be understood that within the scope of the claims, the invention may be practiced otherwise than as specifically described herein.

What we claim is:

1. A flexible electrode array comprising silicone containing oxide particles of $SiO_2$, $TiO_2$, $Sb_2O_3$, $SnO_2$, $Al_2O_3$, ZnO, $Fe_2O_3$, $Fe_3O_4$, talc, hydroxyapatite or mixtures thereof and at least one metal trace embedded in said flexible electrode array; wherein
    said oxide particles are between 0.5 µm and 100 µm in diameter.

2. The flexible electrode array of claim 1 further comprising a flexible circuit cable and an interconnection pad.

3. The flexible electrode array of claim 1 comprising $SiO_2$.

4. The flexible electrode array of claim 1 wherein said flexible electrode array comprising silicone is an elastomer formulation, silicone craft polymer, silicone copolymer, silicone-silicone copolymer, silicone-hydrocarbon copolymer, silicone block polymer, silicone block copolymer, silicone rubbers or mixtures thereof.

5. The flexible electrode array of claim 1 wherein said oxide particles are silica structures, silica foam, fumed silica, polycrystalline, fibers, fiber pieces or mixtures thereof.

6. The flexible electrode array of claim 1 wherein the proportion of said oxide particles contained in said flexible electrode array is between 1 and 50 vol. % or 1 and 30 wt. %.

7. The flexible electrode array of claim 1 comprised of a first polymer layer coated with said oxide particles and a second polymer layer coated on said first polymer layer containing no oxide particles.

8. The flexible electrode array of claim 1 comprising metal traces of one or more of the following metals titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, or gold, or an alloy of two or more metals, or a combination of two or more alloys or metal layers thereof.

9. The flexible electrode array of claim 1 comprising one or more of the following metals titanium, tantalum, chromium, iridium, palladium, platinum, silver, or gold, or an alloy of two or more metals, or a combination of two or more alloys or metal layers thereof.

10. The flexible electrode array of claim 1 wherein said trace is 5 µm to 50 µm wide.

11. The flexible electrode array of claim 1 wherein said trace is 10 µm to 20 µm wide.

12. The flexible electrode array of claim 1 wherein the distance between said traces is 5 µm to 50 µm.

13. The flexible electrode array of claim 1 wherein the distance between said traces is 10 µm to 20 µm.

* * * * *